United States Patent [19]

O'Keeffe et al.

[11] 4,008,402
[45] * Feb. 15, 1977

[54] METHOD AND APPARATUS FOR ELECTRON BEAM ALIGNMENT WITH A MEMBER BY DETECTING X-RAYS

[75] Inventors: Terrence W. O'Keeffe; Alan J. Simon, both of Pittsburgh, Pa.

[73] Assignee: Westinghouse Electric Corporation, Pittsburgh, Pa.

[ * ] Notice: The portion of the term of this patent subsequent to Oct. 8, 1991, has been disclaimed.

[22] Filed: July 18, 1974

[21] Appl. No.: 489,638

[52] U.S. Cl. .................. 250/492 A; 219/121 EM; 250/397; 313/471
[51] Int. Cl.² ................ H01J 29/50; H01J 31/49
[58] Field of Search ............. 250/492 A, 397; 313/471; 219/121 EM

[56] References Cited
UNITED STATES PATENTS

| | | | |
|---|---|---|---|
| 3,081,414 | 3/1963 | Goodman | 313/471 X |
| 3,691,424 | 9/1972 | Goodman | 313/471 X |
| 3,840,749 | 10/1974 | O'Keeffe et al. | 250/492 A |
| 3,842,279 | 10/1974 | Schumacher | 250/397 |

*Primary Examiner*—Alfred E. Smith
*Assistant Examiner*—T. N. Grigsby
*Attorney, Agent, or Firm*—C. L. Menzemer

[57] ABSTRACT

A method and apparatus are provided for alignment of an electron beam with precisely located areas of a major surface of a member. Marks of predetermined shape are formed of X-ray producing material and are positioned adjacent the major surface of the member which is preferably substantially transparent to the X-rays generated by the marks. An electron beam to be aligned has at least one alignment beam portion of a predetermined cross-sectional shape and preferably corresponds in dimensional accuracy to the alignment accuracy desired. The X-ray emissions are detected by a detector means preferably positioned adjacent the opposite surface of the member. The position of the electron beam is moved relative to the member while continuing said detection until the X-ray emissions detected indicate alignment of the alignment beam portion with a corresponding mark. Preferably, said alignment method is used in producing a very accurate component pattern in an electroresist layer supported by a member utilizing either a scanning electron beam or an electron image projection system for the electron radiation beam.

16 Claims, 7 Drawing Figures

METHOD AND APPARATUS FOR ELECTRON BEAM ALIGNMENT WITH A MEMBER BY DETECTING X-RAYS

GOVERNMENT CONTRACT

This invention is made in the course of or under Government Contract F 30602-69-C-0280.

FIELD OF THE INVENTION

The present invention relates to the making of integrated circuits, acoustic surface wave guide devices, magnetic bubble devices, opto-integrated devices and other micro-miniature electronic components with submicron accuracy.

BACKGROUND OF THE INVENTION

The present invention is an improvement on the electron beam fabrication system described in U.S. Pat. No. 3,679,497, issued July 25, 1972, and assigned to the assignee of the present invention.

The electron beam fabrication system employs a scanning electron microscope to produce a photocathode source or electromask. The photocathode source is adapted to project, on irradiation typically by ultraviolet radiation, an electron beam in the desired pattern which impinges on an electroresist layer on a major surface of a member to implant in said resist layer a differential solubility between the irradiated and the unirradiated areas. Removing the more soluble portions of the electroresist layer after irradiation selectively exposes the underlying member or layer on the member which can in turn be selectively altered through windows in the electroresist of the desired component pattern, typically by etching, diffusion or deposition.

The electromask designates the pattern-bearing photocathode assembly which is analogous to the photomask in the well known photolithographic techniques. The electromask comprises a light transmissive substrate such as quartz on which the photocathode source is supported. The photocathode source is usually adapted to generate the patterned electron beam by overlaying the substrate with a layer such as titanium dioxide which is opaque to the radiation to which the photocathode material is sensitive. The negative of the desired component pattern is formed in the opaque layer and thereafter a contiguous layer of a photocathodic material such as palladium is formed thereover. The patterned electron beam thereafter is generated by irradiating the photocathode layer through the substrate and the opaque layer. See, e.g., U.S. Pat. Nos. 3,585,433, 3,588,570, 3,686,028 and 3,672,987.

The scanning electron microscope of such fabrication system involves the use of a finely focused electron beam to generate a planar component pattern, with submicron accuracy, in an electroresist layer or the like. The electron beam is automatically moved through the pattern matrix on command from a computer. The beam control information can be stored on a magnetic tape which is fed into the computer, which it is used to command the position and movement of the electron beam. Such a scanning electron beam system can be used to directly develop a high resolution pattern in an electroresist in making an integrated circuit.

The main problem in the use of such scanning electron beams is maintaining the accuracy over the entire pattern field. Resolution as such is not a problem in the use of the scanning electron beam. Lines less than 0.5 micron in width can be reliably reproduced in resist materials. However, the pattern field size of integrated circuits are typically as great as 2000 × 2000 microns and often as great as 4000 × 4000 microns. For electron optical reasons it is impractical to deflect the electron beam through more than a few degrees and still hold the high resolution of, for example, 0.5 micron. It is possible to increase the field size by increasing the distance between the deflecting means and the electroresist, but this correspondingly increases the diameter of the focused electron beam and in turn sacrifices resolution. Thus, for a given resolution, the field size for the scanning electron beam is usually restricted to considerably less than the member size of the integrated circuit. For example, for an electron beam of 0.2 micron in diameter and a resolution of 0.5 micron, the throw of the electron beam is limited to 2 inches and field size is limited to about 2000 microns in diameter.

Another restriction on the size of the field is the accuracy with which the electron beam can be deflected. This depends primarily on the electronics used to control the beam position. At present, the deflection accuracy of an electron beam of 0.2 micron diameter in a 2000 micron field is at best about 0.5 micron. Thus, a typically 2000 × 2000 micron field of a scanning electron beam system is divided into 4000 × 4000 array of points each 0.5 micron apart; with the 4000 addresses on each axis provided by a 12 bit digital-analog converter. While memories are available with far greater numbers of addresses, larger fields and greater resolution within the same size fields cannot be obtained because of beam deflection limitations.

Ideally the problem can be remedied by sequentially developing the electroresist in multiple patterns of small fields. However, accurate registrations between contiguous fields is essential to the operability of such a technique. The high resolution, e.g. 0.5 micron, of the scanning electron beam system is lost unless the same resolution can be maintained in alignment of the successive patterns. Thus, the electron radiation for each field must be aligned with respect to the adjoining field with a precision of 0.5 micron or less. Otherwise the precisions and economics of the electron beam fabrication system will not be attained in the integrated circuit device.

It has been proposed to simply accurately move the member on which the integrated circuit is to be formed from field to field by mechanical means, using a laser beam to maintain registration, see e.g., U.S. Pat. Nos. 3,632,205 and 3,719,780. However, such a system is not believed commercially practical. A change of only 0.01 percent in the physical alignment of the member can lead to an 0.2 micron error in the registration of adjacent fields. On a 2 × 2 inch member such an alignment error results from an 0.002 inch variation in dimension. Further, the deflection aberrations of the electron beam are such that an exactly regular rectangular array of fields is impossible to attain. Even with compensation, distortions remain that add to the mismatch between adjacent fields. Thus, a need exists for a multiple sequential alignment system which will accurately and rapidly register adjacent fields of a desired electroresist pattern.

The need is particularly acute in Large Scale Integration (LSI) technology. LSI is the term applied to integrated circuits which provide high complexity electronic circuits (e.g. more than a thousand gates) in the same semiconductor wafer. Logically LSI technology requires larger and larger wafers; and LSI wafers measuring 2 and 3 inches on a side are now used. However, such large patterns can be generated with a scanning electron microscope only by combining several fields, where accurate registration between fields is essential. Moreover, LSI technology requires a greater density of electronic components and in turn better generation and alignment resolution. The quantative yield of such integration corresponds directly to the size of the wafer. The probability of defects in the single crystal structure increases directly with the volume of the wafer. Thus, the higher the resolution that can be attained, the greater the circuit density that can be utilized, the smaller the wafer size that is needed, the greater the quantative yield of the integration that results.

In the electron image projection system, there is also a need for precision registration and alignment of the patterned electron beam from the photocathode source and the member. The resolution of the electron beam image projection system, e.g., less than 0.5 micron, is lost in a juxtaposition of component patterns unless the same resolution can be maintained in the alignment of successive electromasks. Making of an integrated circuit device requires, for example, registration and irradiation of at least two to ten different juxtapositioned component patterns in electroresist patterns that are subsequently developed and transferred to the component layer by etching, doping or deposition. The electron radiation of each pattern must be aligned with precisely located areas on the major surface of the member each time with a position of 0.5 micron or less with respect to the first pattern. Otherwise, the precision and economies of the electron fabrication system will not be obtained in the finished integrated circuit device.

Apparatus has been developed for precision juxtaposition of multiple component patterns by use of electron beam induced conductivity marks (EBIC), see, e.g., U.S. Pat. No. 3,710,101, granted Jan. 9, 1973 and assigned to the same assignee as the present application. The alignment system comprises at least one and preferably two spaced apart alignment electron beam marks or portions of predetermined cross-sectional shape as part of the photocathode source; and detection marks of predetermined shapes, preferably of the same shape and dimensions as the corresponding alignment beam portions, are formed in an oxide layer on a member and overlaid with a metal layer.

A DC potential is applied across the oxide layer between the metal layer and the member. The subsequent current flow between the terminals will vary in accordance to the portion or area of the detector mark irradiated by the corresponding alignment beam portion. Thus, the alignment beam portion can be precisely aligned with the detector mark by reading the electron induced current corresponding to the area of the detector mark irradiated. Electrical current flow may be processed through an amplifier to actuate a servomechanism to move the photocathode source or the substrate, or to change the magnetic field of focusing and deflecting electromagnetic coils surrounding the photocathode source and member to align and direct the electron beam pattern, and in turn provide automatic alignment of the alignment beam portions and corresponding detector marks.

High precision in positioning the electron beam pattern is possible with this alignment system by making the alignment beam portion of the photocathode source and the detector marks of the same dimensions and relative spacings. Such alignment system is capable of automatically positioning both alignment bean portions on their corresponding detector marks to an error of about ±0.1 micron within a few seconds. The performance of such alignment beam system is therefore completely adequate to provide the necessary accuracy and speed of alignment.

However, the difficulty with this alignment system is that the detector marks must be fabricated on the member itself. Although this can be accomplished in some instances with negligible interference, it may require additional fabrication steps to prepare the detector marks on the member for the alignment system. Specifically, before alignment and exposure of each successive pattern, the electroresist layer must be removed from the area adjacent to the detector marks and a metal layer evaporated over such area to fabricate the detector mark.

Further, steps must be taken during the processing to ensure preservation of the alignment marks in the insulator layer through the various processing steps involved in fabrication of the integrated circuit. For example, where an epitaxial growth is required, the detector mark areas must be masked to ensure that growth does not occur over the insulator layer and obliterate the alignment detector mark. Alternatively, precautions must be exercised through the various processing steps such as diffusion, oxidation, depositions, etc. to ensure in particular that sufficient contrast is maintained between the thick and thin portions of the insulator layer which define the detector marks.

Moreover, the alignment system requires providing a circuit across the detector marks which is expensive and cumbersome; remote readings from the detector marks cannot be made.

SUMMARY OF THE INVENTION

A method and apparatus are provided for the alignment of an electron beam with selected areas of a major surface of a member with any desired degree of accuracy, for example, of 0.5 micron or less. The optical distortion and deflection inaccuracies of a scanning electron beam can all but be eliminated by permitting the scan to be done in smaller fields, e.g. 200 × 200 microns square, because of the precision alignment which the invention permits to be maintained between fields. The invention also permits precision alignment of a photocathode source or series of photocathode sources with selected areas of a major surface of a member in the electron image projection system.

Generally at least one and preferably at least two detector marks capable of generating x-ray radiation corresponding to the area of each mark irradiated by an electron beam are formed adjacent a major surface of a member. The marks are of a predetermined shape and preferably in accurate spatial relation relative to each other. At least one x-ray generating mark irriadiated with a corresponding alignment beam portion of the electron beam to be aligned. The alignment beam portion and detector marks are of predetermined cross-sectional shapes and preferably are formed to accuracies corresponding to the desired alignment accuracy, e.g. ±0.5 micron in diameter or width for 0.5 micron alignment accuracy. The x-ray emissions from the irradiated x-ray generating mark or marks are detected by a detector means preferably through the member. The electron beam is moved relative to the substrate until the x-ray radiation emissions detected from the irradiated marks by detector means indicates alignment of the alignment beam portion with a corresponding detector mark.

The alignment beam portions and the detector marks may be of any suitable relative size within practical limits provided the shapes of both are predetermined to a desired accuracy. Preferably, however, each alignment beam portion is of the same cross-sectional shape as the predetermined shape of the corresponding detector mark so that alignment can be determined simply by reading a maximum or a minimum in the electrical signal from the detector means. Otherwise, electrical processing of the electrical signals are needed, while the alignment beam portions are oscillated over the corresponding detector marks, to determine optimum alignment of the alignment beam portions with the corresponding detector marks.

The detector marks of x-ray generating material may in certain applications be directly formed on or in the major surface in the predetermined shape. In other applications, it may be more appropriate that the x-ray generating marks be formed by providing adjacent an x-ray generating layer a layer of material opaque to x-ray or electron radiation. The opaque layer causes a differential in x-ray radiation projected by the x-ray generating layer either by blocking the x-ray radiation generated by the x-ray generating layer or by blocking the electron radiation irradiating the x-ray generating layer. To illustrate, an opaque layer capable of reducing the x-ray emissions of an x-ray generating layer is formed adjacent the major surface of the member, windows are then opened in the opaque layer corresponding to the desired x-ray generating marks, and contiguous layers of x-ray generating material are formed over the major surface at least at the windows so that the opaque layer circumscribes a portion of the x-ray generating layer in the predetermined shape.

Further, the negative of these various embodiments may be desired in certain applications. That is, the opaque layer may be in the predetermined shape either above or below the x-ray generating layer. Or, the x-ray generating layer may simply circumscribe an exposed portion of the major surface, the exposed portion being in the predetermined shape for the x-ray generating marks.

Preferably, the alignment method is used in producing a very accurate component pattern in an electroresist layer supported by a member in making integrated circuits of high component density and high resolution. A scanning electron beam for an electron image projection system, such as are described in above-cited U.S. Pat. No. 3,679,497, is preferably utilized as the electron radiation beam. Where a scanning electron beam is used, the beam operates in its entirety as the alignment beam portion in the system, and the selective irradiation is preferably performed in contiguous fields, e.g. 200 × 200 microns. The electron beam is thereby aligned with the member at least between the irradiating of each field to register the member and the electron beam from field to field preferably by positioning the marks symmetrically along the boundaries of the fields.

Where an electron image projection system is used, the selective irradiation is usually performed simultaneously over the entire surface of the member. Preferably at least two widely spaced apart x-ray generating marks of predetermined shape are simultaneously irradiated in performing the alignment either prior to or during selective irradiation of the member. The patterned electron beam projected by the photocathode source includes alignment beam portions of predetermined cross-sectional shape which are preferably the same shape as corresponding x-ray generating mark or marks. Further, with an electron image projection system, the alignment method can be used for juxtaposition alignment of a set of component patterns in making an integrated circuit or other micro-miniature electronic component. A set of photocathode sources are prepared having as part of their patterned electron beam alignment beam portions of substantially identical cross-sectional shape and spatial position. The alignment steps can thus sequentially be repeated with the different photocathode sources of the prepared set in making a precision integrated circuit.

Other details, objects and advantages of the invention will become apparent as the following description of the present preferred embodiments and present preferred methods of practicing the same proceeds.

BRIEF DESCRIPTION OF THE DRAWINGS

In the accompanying drawings, the present preferred embodiments of the invention and present preferred methods of practicing the invention are illustrated in which.

DESCRIPTION OF THE PREFERRED EMBODIMENTS

Figure 2:
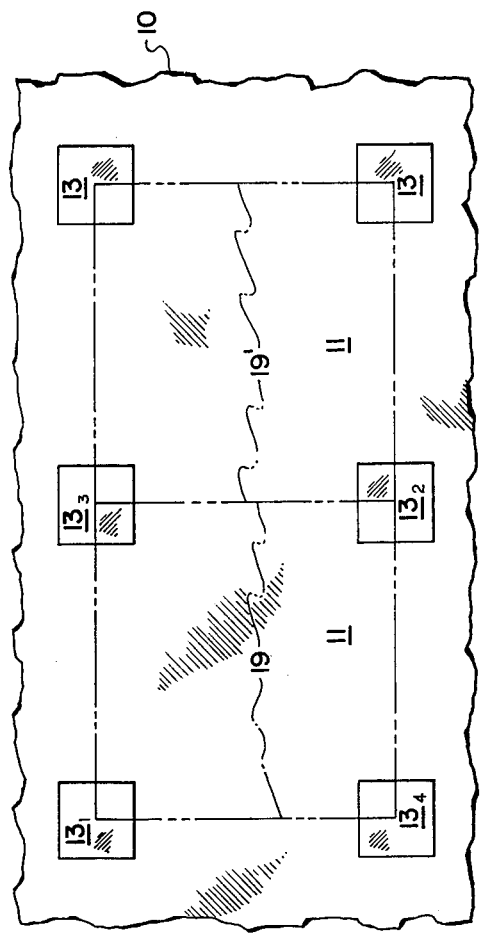
FIG. 2 is a partial top view of the member of FIG. 1 without the electroresist layer applied.
Figure 3:
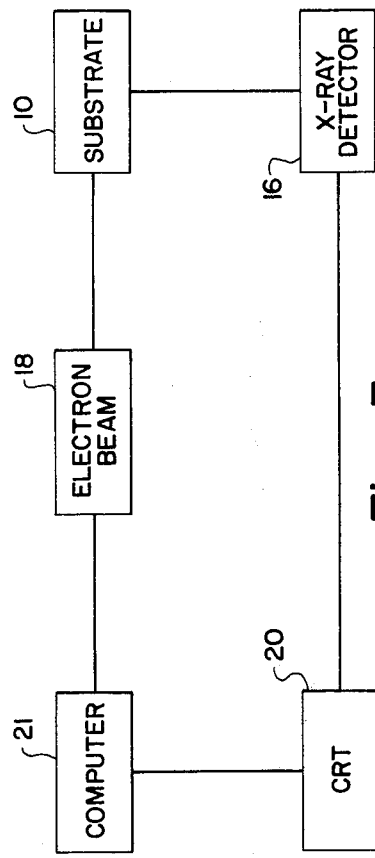
FIG. 3 is a flow diagram showing the interrelationship of functional components in utilizing the present invention to align the scanning electron beam as shown in FIG. 1.
Figure 1:
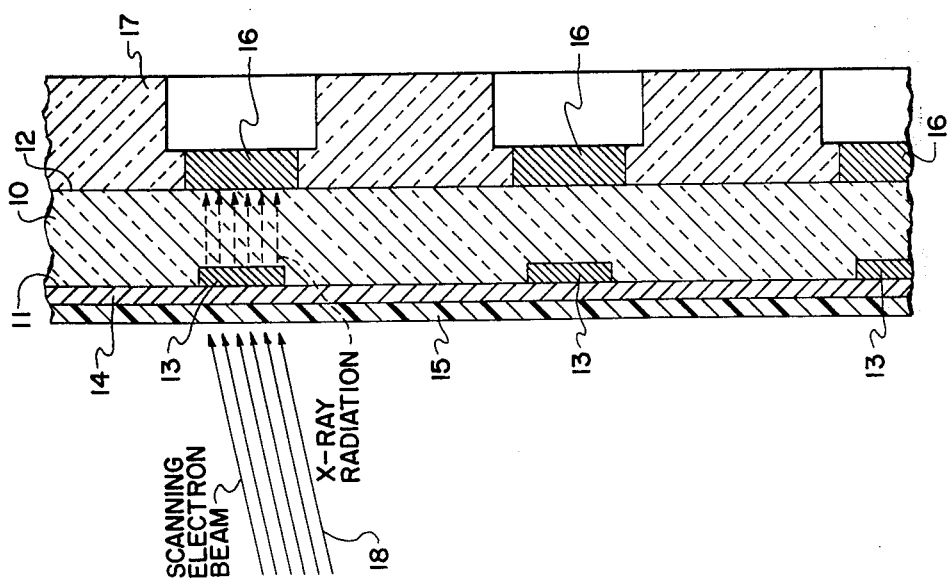
FIG. 1 is a schematic illustration of production of a highly accurate component pattern in an electroresist layer on a member utilizing a scanning electron beam in accordance with the present invention.

Referring to FIGS. 1, 2 and 3, a method is shown for producing a highly accurate pattern in an electroresist on a member by aligning an electron beam relative to the member. A scanning electron microscope adaptable to the present invention is shown in above-cited U.S. Pat. No. 3,679,497, assigned to the same assignee as the present invention.

Referring specifically to FIG. 1, member 10 having major surfaces 11 and 12 is provided with a closely spaced regular array of marks 13 of predetermined shape of x-ray generating material formed adjacent major surface 11. Marks 13 are recessed in the surface of member 10 to provide a planar surface 11 for subsequent processing. Member 10 is selected of a material and thickness suitable for transmission of a substantial portion of the x-ray radiation produced by marks 13. Member 10 is typically silicon, sapphire, spinel or quartz having a thickness between 1 and 30 mils in thickness. The most desired thickness will also vary with the energy of the electron radiation as hereinafter described. For example, whereas a negligible fraction of 5 kev. x-rays will penetrate a silicon wafer 10 mils in thickness, a reasonable fraction ($\sim$ 30 percent) of x-rays with 10 kev. energy will penetrate a silicon wafer of 10 mils thickness.

X-ray generating marks 13 may be in any regular array as desired. Preferably the pattern is symmetrical to facilitate alignment of a scanning electron beam from field to field as hereinafter described. The marks may form in a single parallel-line pattern, in a line-grid, or in spaced rows as shown in FIG. 2. In any case, the shapes of marks 13 and spacing between marks 13 are selected to provide the desired alignment accuracy, and preferably the size, i.e. width or area, of marks 13 are selected to correspond to the desired alignment accuracy. Typically, the marks will have a width (or diameter) less than 2 microns ±0.5 micron and a spacing center-to-center of between 200 and 2000 microns. The alignment system resulting has a usual accuracy of 0.5 micron or less. In this connection, it should be noted that equivalent x-ray generating marks 13 can be obtained by forming the x-ray generating material in the negative of the marks 13. That is, x-ray generating layers are formed to circumscribe exposed portions of the surface of the members which are in the predetermined shape of the desired x-ray generating marks.

The composition and thickness of x-ray generating marks 13 must be selected to provide sufficient contrast in x-ray production between themselves and the surface layer of the surrounding part of the member. Since most substrate materials have relatively low atomic number, e.g. Si, $SiO_2$, $AlO_3$, $MgOxAl_2O_3$ (where $x$ is between 0.64 and 6.7), the marks are preferably made of materials with high atomic numbers. In addition, the material for marks 13 should be in dense form (usually associated with high atomic numbered materials) so that only a thin layer need be used and high resolutions can be maintained by use of chemical etching resist rejection, ion etching, etc. The x-ray generating material should in addition be capable of being applied to the substrate in such manner that it is substantially unaffected and has negligible effect on the regular processes by which the member is converted to the finished structure.

Preferably the x-ray generating marks are made of molybdenum, hafnium, tantalum, tungsten or gold. Gold is, however, not preferred where the member is being processed into an integrated circuit because integrated circuits typically utilize fabrication steps with temperatures in the 1000° to 1200° C range. Gold has a relatively low melting point and would not survive such high temperature processing. Further, gold is notorious for its extremely high diffusion coefficient in silicon and its effect on minority carrier lifetimes in silicon, which makes it deleterious to integrated circuit fabrication. Further, in high temperature processing there is a need for stability in oxidation of the x-ray generating material. Oxides with high oxygen contents are less efficient in x-ray generation because electrons stopped by the low atomic number oxygen will produce few x-rays. In addition, certain materials such as tungsten have a particularly high vapor pressure which causes detrimental loss of the metal to the ambient during oxidation. To remedy the uncertainty, a possible solution is to sputter deposit the oxide directly to form the x-ray generating marks.

A particularly useful composition contemplated for the x-ray generating marks 13 is a mixture of hafnium and tantalum nitrides. Mixtures of hafnium and tantalum oxides have heretofore been widely used in integrated circuits to provide resistive thin films. Such films are conveniently deposited by sputtering techniques, the ratio of elements depending upon the resistivity of the film. Such films are contemplated to be relatively stable under silicon oxidation conditions. Alternatively, the x-ray generating material may be coated or clad with isolating layers such as silicon dioxide or silicon nitride to prevent oxidation. Such effective masking or clading of the x-ray generating material is contemplated to allow metal such as tungsten and molybdenum, which have relatively rapid oxidation rates, to be used in the invention for integrated circuit fabrication.

Still referring to FIG. 1, a layer 14 of a desired material such as metal, an insulator or a semiconductor material in which a component pattern is desired is formed over exposed portions of surface 11 and marks 13 by sputtering, vapor deposition, epitaxial growth or any other suitable technique. Layer 14 may also provide a suitable isolating layer against oxidation of the marks 13. Thereafter, a contiguous electroresist layer 15 is overlaid on layer 14 over major surface 11 and marks 13. An electroresist is a material which is sensitive to electron radiation to form in a layer thereof a pattern of differential solubility. That is, the electron irradiated portion of the layer is made either more or less soluble to certain solvents that the non-irradiated portion of the layer. Preferably the electroresist layer is light insensitive and relatively stable and has a relatively long shelf life. Examples of negative resists are polystyrene, polyacrylamide, polyvinyl chloride and certain selected hydrocarbon silicones. Examples of positive resists are polyisobutylene, polymethylemethacrylates, and poly(alpha-methylstyrene).

A good positive resist is polymethylmethacrylate of an average molecular weight of over 100,000 containing a very low fraction of polymer having molecular weight of 50,000 or less to avoid pin holes during processing. It is rendered readily soluble in either 95 percent ethanol (5 percent water) or in a mixture of 30 percent by volume of methylethyl ketone and 70 percent isopropanol when subjected to an electron beam at 10 kilovolts to supply $5 \times 10^{-5}$ coulombs per $cm^2$. The portions so exposed are soluble in the previously mentioned solvent, whereas the remainder of the resist coating is not as soluble in such solvent.

Polyacrylamide is a good negative resist inasmuch as the electron beam at 10 kilovolts applying $3 \times 10^{-6}$ coulombs per $cm^2$ will render it slowly soluble in deionized water, while the remainder of the coating will resist concentrated phosphoric acid, which renders it useful as a coating for aluminum. This electroresist is not removed by most organic solvents such as methanol. It forms an excellent mask for a sputtering-etch treatment of the substrate. The average molecular weight of a good polyacrylamide resist that has given good results is $4.5 \times 10^7$.

The electroresist may also be provided by any of the various commercially available "photoresist" materials that are sensitive to electron bombardment to become more soluble or insoluble in specified solvents. Three such photoresists are AX-1350 and AZ-1350H made by Shipley and Microline PR-102 made by GAF.

The electroresist may also be one of various inorganic compounds as well as organic compounds. For example, silicon dioxide and silicon nitride ($Si_3N_4$) coatings on a substrate when subject to an electron beam are rendered more soluble in an etchant. Buffered hydrofluoric acid will dissolve more readily the electron beam treated portions of a silicon dioxide layer as compared to the portion of the layer not treated with the electron beam. This characteristic is known as the "BEER" effect (i.e. Bombardment Enhanced Etch Rate). Etch enhancement ratios of about 3 are obtained, so that the electron beam bombarded portions will be completely etched away while there will be only as little as a third of the unbombarded layer that will be etched away.

For example, silicon substrates with an oxide layer of a thickness of about 10,000 A has areas electron irradiated to a total of 0.5 coulombs per $cm^2$ and then etched electrolytically with "P" etch at 6 volts with the silicon being anodic to yield etch rates of 142 A per minute for the unirradiated areas and 416 A per minute for the electron irradiated areas. When the same silicon substrate was made cathodic at 6 volts, all other procedures remaining the same, the etch rates were 134 A per minute for the unirradiated portions and 391 A per minute for the electron irradiated portions. Again, when the silicon substrate was made cathodic at 15 volts, the relative etch rates were 153 A per minute for the unirradiated portions and 460 A per minute for the electron irradiated portions. It should be noted for this example that the etchant employed was a buffered solution of hydrofluoric acid (pH 6.5) which is an aqueous solution 10 M in $NH_4F$ and 2.62 M in HF. It was also found that the electron beam can be supplied as little as 0.25 to 1 coulomb per $cm^2$ to secure enhanced etching in silicon dioxide layers of 10,000 A in thickness; the unirradiated portions were etched to 7000 to 8000 A in thickness while the 0.5 and 1.0 coulomb per $cm^2$ irradiated portions were completely etched through.

Irrespective of the composition, the thickness of electroresist layer 15 is also important to the definition of the pattern formed in it. The thickness of the resist layer 15 must be on the order of the resolution desired in the component pattern. Typically, the thickness will be between about 0.2 and 1.0 microns. If the desired resolution is 0.1 micron, then the electroresist layer need be on the order of 0.5 micron or less.

One or more detector means 16 are positioned in holder 17 adjacent the opposite surface 12 of the member to circumscribe the x-ray generating marks 13. That is, each detector 16 is positioned adjacent one or more marks 13 to detect x-rays generated on irradiation of said marks 13. This arrangement of course supposes that the member is substantially transparent to the x-ray emissions; if the member is not able to transmit the x-ray radiation, the detectors may be positioned on the same side of the member as the electron beam and close to the marks as physically possible to avoid loss of resolution by radiation scattering.

Although higher energy electron radiation is beneficial for transmission through the substrate, higher energy radiation is detrimental to subsequent detection in a detector of finite thickness. Suitable detectors for detector means 16 are surface barrier silicon diode particle detectors of large depletion widths, i.e. sensitive thickness, made by ORTEC, Inc. Although detectors with depletion widths up to 25 mils are available, typically such detectors have depletion widths of about 4 mils.

Referring specifically to FIGS. 2 and 3, this arrangement can be used to align scanning electron beam with major surface 11 of member 10 field by contiguous field for selection irradiation of precisely selected areas of the major surface of the substrate. As shown in FIG. 2, member 10 is divided into contiguous fields 19 and 19' preferably bounded symmetrically in quadrature by the marks 13, e.g. one at the intersection of each field, or one at the center along each side of each field. To align electron beam 18 with, for example, field 19, the scanning electron beam 18 is modulated to overlap two opposite marks, for example marks $13_1$ and $13_2$ sequentially. The output signals from detectors 16, positioned adjacent marks $13_1$ and $13_2$, respectively, are fed to a cathode-ray tube 20 which also has the intended locations of marks 13 for precise alignment inputted from the computer 21 controlling scanning electron beam 18. The scanning beam 18 is thus moved relative to the member 10 until the signals from the two detectors $16_1$ and $16_2$ indicate optimum alignment of beam and marks and also alignment of the superimposed input of the intended locations of the marks $13_1$ and $13_2$. Electron beam 18 is then modulated to overlap the other two opposite marks $13_3$ and $13_4$ sequentially until the outputs therefrom coincide on the CRT 20 with optimum alignment of the beam and marks and also alignment of the superimposed desired input for marks $13_3$ and $13_4$ from computer 21. Electron beam 18 is then aligned and ready to selectively irradiate the field on command from computer 21. At the end of the irradiation of the field 19, member 10 is physically moved so that the scan field of the electron beam is concurrent with the next field 19' on the member 10 to be selectively irradiated. The aligning sequence is then repeated as described above. At each field 19, alignment is made by manually or automatically actuating means to move member 10 relative to beam 18 as described in above-cited U.S. Pat. No. 3,679,497, or to move beam 18 relative to member 10 by deflecting the electron beam electromagnetically. The alignment is accomplished by moving the beam or member relative to the other until the x-ray radiation emissions detected by detectors 16 indicate predetermined alignment values for said x-ray emissions.

It should be noted that said predetermined alignment value will vary with the relative relation of the predetermined shape of the x-ray generating marks 13 and the predetermined cross-sectional shape of the electron beam 18. Where the predetermined shapes are the same, alignment is simply a matter of reading the indication of maximum or minimum x-ray generation. Where the predetermined cross-sectional shape of electron beam 18 is different from the predetermined shapes of the corresponding marks 13, readings to determine alignment is somewhat different. Optimum alignment is no longer indicated by the maximum of minimum in the signal readings with x-ray generation. Rather, plateaus are reached in the signal readings, and optimum alignment is achieved by either selecting a certain point on each plateau taking into consideration any change in the geometric shapes of the electron beam and the marks, or selecting a certain point on the signal rise from the means as the electron beam moves into or out of the area of the corresponding mark. The latter alignment sequence permits alignment with the edge of the mark.

The alignment system shown in FIG. 3 is what one skilled in the art would connote a manual system because an operator makes the adjustments to align in accord with the read-out on the CRT. This is not a preferred system because of the relatively long length of time required to complete the alignment sequence. Therefore, it is that the alignment sequence is preferably adapted to an automatic alignment system with electrical signal processing apparatus such as that hereinafter described.

After alignment, electron beam 18 is moved at each field 19 through a predetermined matrix corresponding to a desired component pattern to be formed in or through layer 14, or the negative thereof. Whether beam 18 irradiates the positive or the negative of the desired component pattern is dependent on the type of electroresist used. If a positive resist is used, i.e. where the irradiation makes the resist layer more soluble in a given solvent, then the positive of the desired electronic component pattern to be formed in layer 14 is irradiated in layer 15. Conversely, if a negative resist is used, i.e. where irradiation makes the resist less soluble to a given solvent, then the negative of the desired component pattern to be formed in layer 14 is irradiated in layer 15.

In either instance, the accuracy of the system is primarily based on the size of fields 19 in which layer 15 is irradiated and the accuracy of sizing and spacing of marks 13. For example, if the integrated circuit to be formed on the member is 0.080 inch × 0.080 inch and an accuracy of less than 1 micron is desired, the electron scan must be performed in four fields of 0.040 inch × 0.040 inch in size. Or, if an accuracy of less than 0.20 micron is desired, the same member is preferably scanned in 400 fields of 200 × 200 microns.

The marks 13 may be dimensioned so that the detection is totally qualitative. This is, the marks are sized, e.g. 0.5 × 0.5 microns or less (spaced, e.g. 200 ± 0.2 microns apart) so that whenever any light is detected by detector 16 the position of electron beam 18 relative to member 10 is known within a tolerance of 0.2 micron. Alternatively, marks 13 may be larger and the x-ray emissions measured quantatively so that the position of electron beam 18 relative to substrate 10 is accurately known. In any event, marks 13 are of predetermined shapes preferably the same as the cross-sectional shape of the electron beam. The resolution errors rising from electron beam deflections and distortions are reduced to the desired accuracy with the alignment system. Scanning electron beam 18 can thus be aligned with a member with greater accuracy than in prior alignment systems, see above-cited U.S. Pat. No. 3,679,497.

Figure 5:
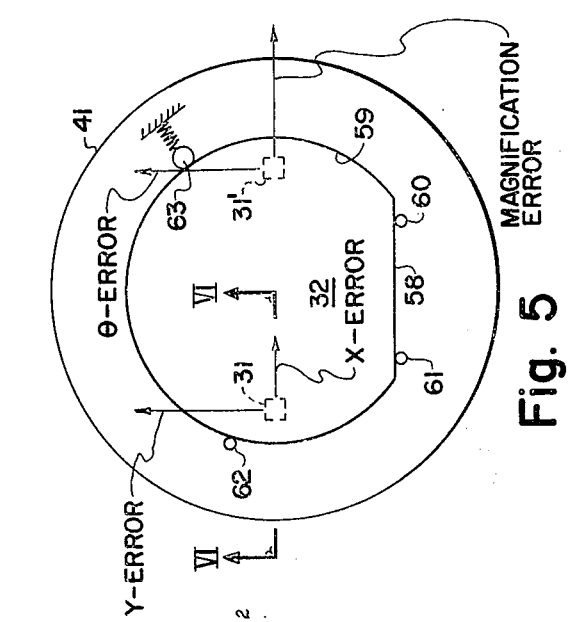
FIG. 5 is a fragmentary cross-sectional view in elevation taken along line V—V of FIG. 4.
Figure 6:
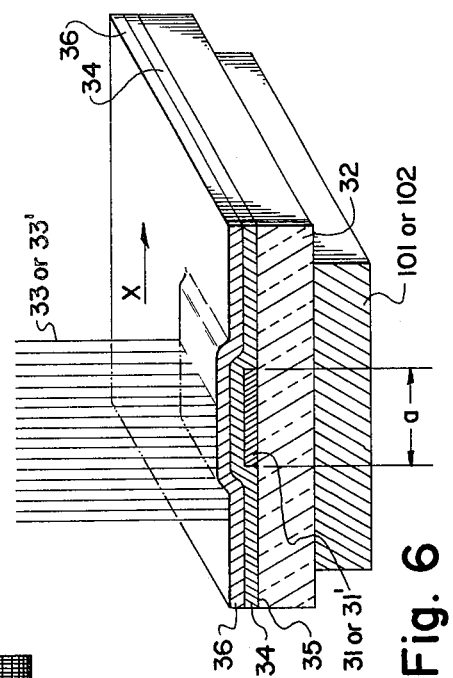
FIG. 6 is a fragmentary cross-sectional view in perspective taken along line VI—VI of FIG. 5.
Figure 4:
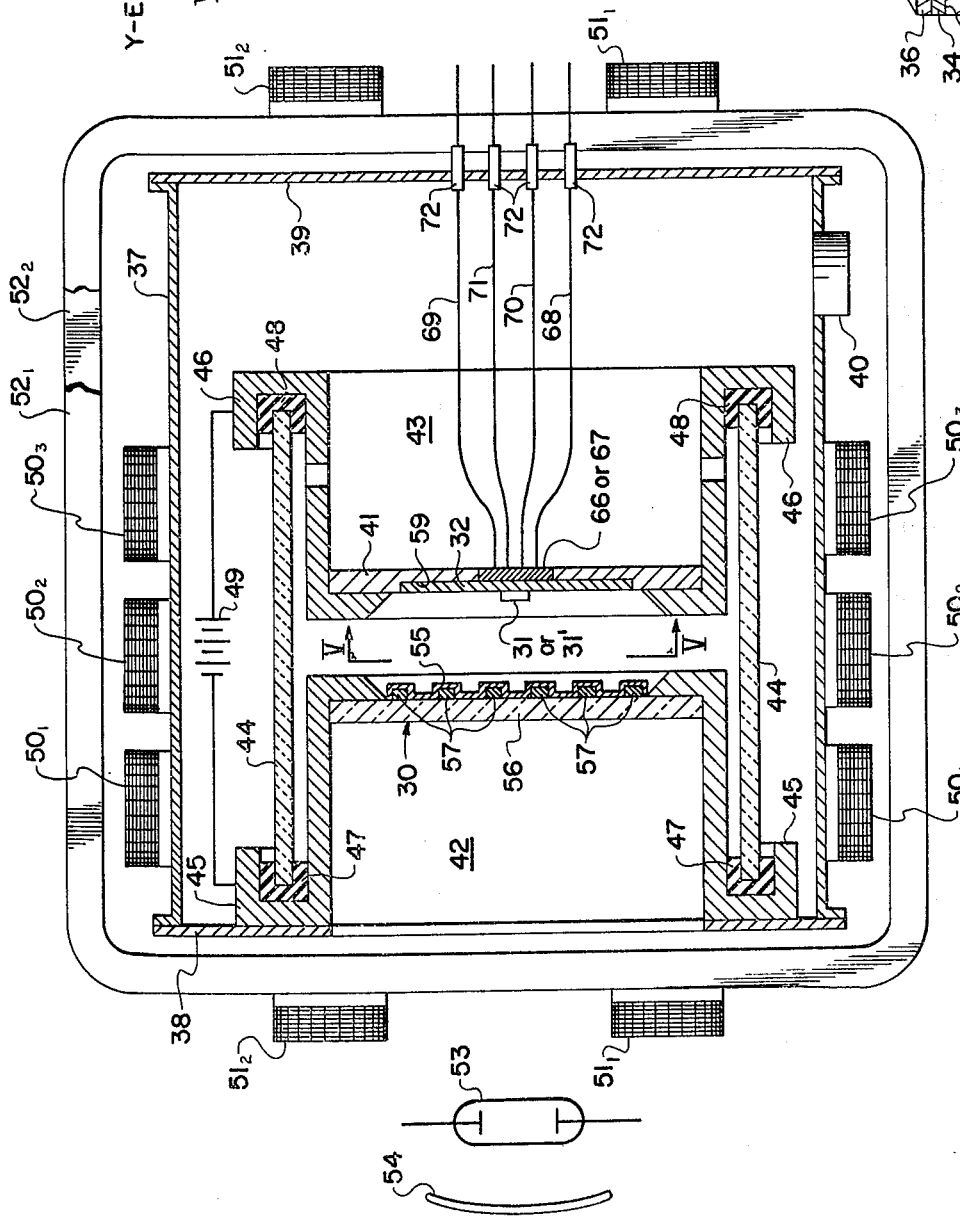
FIG. 4 is a cross-sectional view in elevation of an electron image projection device employing the present invention.

Referring specifically to FIGS. 4, 5 and 6, the present invention preferably is utilized to produce a highly accurate pattern in an electroresist layer on a member in a electron image projection system by a photocathode source. Photocathode source 30 has two x-ray generating marks 31 and 31' of predetermined shapes provided diametrically opposite each other on the periphery of member 32. The patterned electron beam produced by photocathode source 30 includes a set of alignment beam portions 33 and 33' of predetermined cross-sectional shapes and corresponding substantially in spacing to x-ray generating marks 31 and 31' positioned on member 32. In this connection, it should be noted that marks 31 and 31' may in reality be openings in a opaque layer to x-ray or electron radiation material overlaying and adjoining the opaque layer. Thus, the pattern of x-ray emissions from the marks 31 and 31' may correspond to the openings in the opaque layers and provide the equivalent of a closely regular array of x-ray generating marks as described above.

Member 32 with marks 31 and 31' in place is prepared for the electron image projection system by applying or epitaxially growing a layer 34 of suitable material such as a metal or semiconductor material in which or through which a portion of the integrated circuit is to be formed in or to major surface 35 of member 32. Thereafter, electroresist layer 36 in which the desired highly accurate component pattern is to be formed is applied over layer 34. And with electroresist layer 34 applied, member 32 is inserted into the electron image projection system as shown and described in FIGS. 4, 5 and 6 and more fully described in above-cited U.S. Pat. No. 3,679,497 in substantially parallel relationship with photocathode source 30 also positioned in the system.

Referring specifically to FIG. 4, an electron image projection device is shown. A hermetically sealed chamber 37 of nonmagnetic material has removable end caps 38 and 39 to allow for disposition of apparatus into and removal of apparatus from the chamber. A vacuum port 40 is also provided in the sidewall of chamber 37 to enable a partial vacuum to be established in the chamber after it is hermetically sealed.

Disposed within chamber 37 is cylindrical photocathode source or electromask 30 alignable with selected areas of the major surface of member 32 in substantially parallel, spaced relation. Member 32 is supported in specimen holder 41 as more fully described hereinafter. Photocathode 30 and holder 41 are in turn positioned in parallel array by annular disk-shaped supports 42 and 43, respectively. Photocathode source 30 and holder 41 are spaced apart with precision by tubular spacer 44 which engages grooved flanges 45 and 46 via gaskets 47 and 48 around the periphery of supports 42 and 43, respectively. The entire assembly is supported from end cap 38 of chamber 37 at support 42 to allow for ease of disposition of photocathode source 30 and member 32 within chamber 37.

Photocathode 30 is made cathodic and member 32 is made anodic to direct and accelerate electrons projected from the photocathode to the member. To accomplish this, holder 41 and supports 42 and 43 are of highly conductive material and spacer 44 is of highly insulating material. A potential source 49 of, for example, −10 Kv, is applied between supports 42 and 43. The difference in potential is conducted to and impressed on photocathode 30 and member 32 via supports 42 and 43 and holder 41.

Surrounding chamber 37 are three series of electromagnetic coils, positioned perpendicular to each other, to direct and focus the impingement of the electron beam onto member 32. Cylindrical electromagnetic coils $50_1$, $50_2$ and $50_3$ are positioned axially along the path of the electron beam from photocathode 30 to member 32 to cause electrons to spiral and move radially as they travel the distance from the photocathode to the member. These coils permit control of the rotation ($\theta$) and the magnification (M) of a patterned electron beam emitted from the photocathode source and in turn focusing of the patterned electron beam. Rectangular electromagnetic coils $51_1$ and $51_2$, and $52_1$ and $52_2$ are symmetrically positioned in Helmholtz pairs perpendicular to each other, and to coils $50_1$, $50_2$ and $50_3$, to cause electrons to transversely deflect as they travel the distance from the photocathode to the member. These electromagnets permit control of the direction (in X and Y coordinates) of a patterned electron beam emitted from the photocathode.

In operation, light source 53 such as a mercury vapor lamp backed by reflector 54 irradiates a photocathode layer 55 (e.g. gold or palladium) in the photocathode source or electromask 30. The photocathode layer is irradiated through a substantially transparent substrate 56 such as quartz overlaid with layer 57 containing the negative of a desired component pattern. Layer 57 is of material (e.g. titanium dioxide) which is opaque to the light radiation. The photocathode material is thus made electron emissive in a patterned electron beam corresponding to the desired component pattern to be formed in layer 36 or the negative thereof depending (on whether the electroresist is positive or negative) on member 32. A part of the pattern electron beam emitted from the photocathode source 30 is at least one and preferably two relatively small alignment beam portions 33 and 33' of predetermined cross-sectional shape (e.g. squares of 300 × 300 microns) which are spaced away preferably oppositely positioned along the periphery of the patterned beam from the photocathode.

Referring to FIG. 5, member 32 is precision mounted within physically permissible limits in holder 41 and in turn with respect to photocathode 30. Member 32 has flat peripheral portion 58; and holder 41 has depression 59 into which member 32 fits. Holder 41 has pins 60, 61, 62 and 63 positioned in respective quadrants around the periphery of depression 59. Member 32 is positioned by resting flat peripheral portion 58 of member 32 against pins 60 and 61 and curvilinear peripheral portion 64 of member 32 against pin 62. Member 32 is thereby located with an accuracy of about 25 microns or less. Movable pin 63 which is fitted with a compression spring 65, is positioned and pushed against curvilinear portion 64 of member 32 to firmly retain member 32 and in turn, maintain member 32 precisely located.

As shown by FIG. 4, x-ray generating marks 31 and 31' of predetermined shapes are formed on member 32 as above described. Preferably marks 31 and 31' are widely spaced apart along the periphery of the member, and preferably have predetermined shapes the same as the predetermined shape of alignment beam portions 33 and 33' (see FIG. 6), which form a part of the patterned electron beam emitted by the irradiated photocathode source 30. Marks 31 and 31' of predetermined shapes may be reasonably precisely formed by depositing the x-ray generating material on the member 32 through window patterns of the desired cross-section in a photo- or electroresist layer. The predetermined shapes of the alignment beam portions and marks are thus preferably about 20 × 20 mils in any suitable geometric shape, such as a square, rectangle, circle, etc., but most desirably a square array of spaced apart squares for the reasons hereinafter more fully described.

Positioned behind x-ray generating marks 31 and 31' of predetermined shapes in holder 41 are detector means 66 and 67, respectively, with leads 68 and 69, and 70 and 71, respectively, extending through vacuum seals 72 in chamber 37. Detectors 66 and 67 are adapted for detecting the x-ray radiation produced by the marks 31 and 31' through member 32, and are substantially larger in size than and circumscribe marks 31 and 31' so that they can detect even dispersed and scattered x-ray radiation from member 32 close to or in the vicinity of the marks. For this reason, detector means 66 and 67 are also positioned in as close a proximity to member 32 as the geometry will permit. In this connection, it should be noted that in some embodiments, e.g. where member 32 is not transmissive of the x-ray radiation, it may be appropriate to position the detector means on the same side of member 32 as the photocathode source so that x-ray radiation is detected. However, it is preferred that the detector means are positioned in as close a proximity to x-ray generating marks 31 and 31' as the conditions will permit so that resolution of the x-ray radiation and in turn accuracy of alignment is not lost between the x-ray generating marks and the detector means. It is preferred therefore that the detector means be positioned opposite member 32 from the photocathode source where possible so that resolution and accuracy are not lost.

In operation, the alignment beam portions 33 and 33' of predetermined cross-sectional shapes impinge on and overlap x-ray generating marks 31 and 31' of predetermined shapes, respectively. The electron beams typically produce an x-ray radiation which corresponds to the degree of overlap between the alignment beam portions and the marks. Alignment can be accurately recorded therefore simply by observing the signals at detector means 66 and 67. The alignment beam portions and x-ray generating marks can thus be brought into precise alignment simply by detecting as the predetermined alignment value where detected x-ray radiation indicates the optimum alignment of the alignment beam portions with the marks.

The present invention thus provides a method of alignment of the patterned electron beam generated by photocathode source 30 with precisely located areas of a major surface of member 32. Further, the member may be similarly aligned with successive photocathode sources or electromasks by use of the same x-ray generating marks and like alignment beam portions on the successive photocathode sources so that all of the patterned electron beams will selectively impinge on member 32 with the desired precision exactness, e.g. within a fraction of a micron. Error is reduced to the precision with which marks 31 and 31' and the photocathode sources emitting the corresponding alignment beam portion can be shaped and spatially located, which presents no difficulty with the scanning electron microscope and electron image projection system.

The electric current flow from the detector means 66 and 67 may be processed through suitable electronic amplifiers and servomechanisms to automatically shift the entire patterned electron beam relative to the member and precisely position the alignment beam portions 33 and 33' with the marks 31 and 31', respectively. For this purpose, suitable means such as modulation means is preferably used to oscillate the electrical input to the electromagnetic means or coils and thereby cause the alignment beam portions 33 and 33' to oscillate or move in typically a circle over the marks 31 and 31' so that the electrical outputs from detectors 66 and 67 are modulated.

Figure 7:
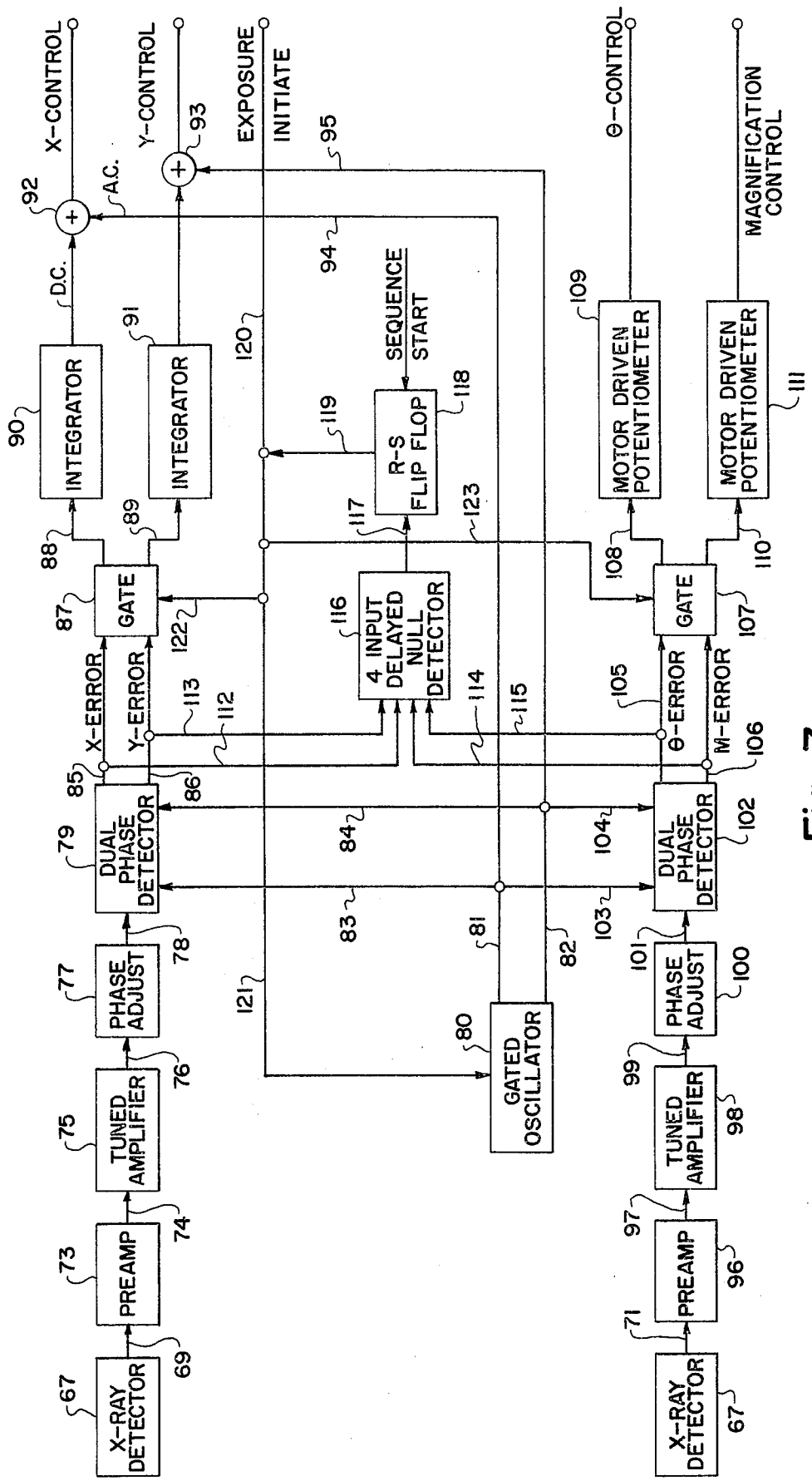
FIG. 7 is a block diagram of an electrical circuit for the electron image projection device shown in FIG. 4 to automatically align the electron beam pattern in accordance with the present invention.

Referring to FIG. 7, there is illustrated in a block diagram the electronics for adjusting the alignment beam portions 33 and 33' with respect to the x-ray generating marks 31 and 31' of the same predetermined shapes and in turn precisely aligning selected areas of the major surface of member 32 with respect to the entire electron beam pattern from photocathode source 30. The modulated electrical signal from detector 66 is conveyed via lead 69 to a preamplifier 73, which amplified signal is then conveyed via lead 74 to a tuned amplifier 75. The output of amplifer 75 passes through lead 76 to a phase adjustor 77 and then through lead 78 to a dual phase detector 79. A gated oscillator 80 impresses reference signals, which are 90° out-of-phase, through conductors 81 and 82 and conductors 83 and 84, respectively, on the dual phase detector 79. The outputs of phase detector 79 thus comprise X-error signals via lead 85 and Y-error signals via lead 86, which pass through gate 87 via leads 88 and 89 to integrators 90 and 91, respectively. The integrators 90 and 91 have direct-current outputs to adders 92 and 93, respectively, where the outputs are modulated with alternating current from the oscillator 80 via leads 94 and 95, respectively. The added modulated signals are then passed to and adjacent the controls in power units (not shown) of the type customarily used to power the electromagnetic coils, in this case the electromagnetic coils $51_1$, $51_2$, $52_1$ and $52_2$ in Helmholtz pairs.

Similarly, the modulated signal from the x-ray detector 67 is conducted via lead 71 to preamplifier 96, and passed thereafter via lead 97 to tuned amplifier 98 and then via lead 99 through phase adjustor 100 and lead 101 to dual phase detector 102. Oscillator 80 suppresses the two 90° out-of-phase reference signals, above referred to, through leads 103 and 104 on dual phase detector 102. Two outputs from dual phase detector 102 are thus produced. The one output signal via conductor 105, which corresponds to a θ error signal, passes through gate 107 and lead 108 to control a motor-driven precision potentiometer 109 to effect the rotational control of the electron beam pattern by increasing or decreasing the current to the electromagnetic coils $50_1$, $50_2$ and $50_3$. The other output signal via lead 106, gate 107 and lead 110 to a motor driven gang potentiometer 111 which adjusts the main focus field controls the size of the patterned electron beam.

The error signals in conductors 85, 86, 105 and 106 are cross-fed electronically via leads 112, 113, 114 and 115, respectively, into a four input delayed null detector 116 whose output is conveyed by lead 117 to a set-reset flip-flop 118. The operation of the flip-flop is initiated by actuation of a start sequence switch whereupon current begins to flow via leads 119 and 120 to energize the ultraviolet source 53 to cause electron beams to be emitted from photocathode source 30, including the two alignment beam portions 33 and 33' of predetermined cross-sectional shapes. Likewise, current from lead 119 passes through lead 121 to the gated oscillator 80, which in turn feeds sinusoidal signals in quadrature through leads 81 and 94 and leads 82 and 95 to the X and Y controls 92 and 93, respectively. The entire electron beam pattern, including the alignment portions 33 and 33' are thus caused to oscillate typically in a circle of, for example, 6 microns diameter at a frequency of 45 Hertz.

Once the alignment portions 33 and 33' are substantially aligned with marks 31 and 31', respectively, by operation of intergrators 90 and 91, and potentiometers 109 and 111, the error signals passing through leads 112, 113, 114 and 115 reach a zero value which is detected by the null detector 116. The null detector thereupon produces an electrical signal which passes through lead 117 to the flip-flop 118, which terminates the operation of the gated oscillator 80 and closes gates 87 and 107 by signals through leads 122 and 123, respectively. The time sequence of the selective electron beam exposure of an electroresist layer on the full area of member 32 is then begun and continued until the resist is fully exposed.

Although it may not be desirable for reasons hereafter described, the detection and alignment may be accomplished in a time substantially less than the time period required to significantly irradiate the electroresist layer 36. A period of from 3 to 10 seconds is usually adequate to produce a sufficient electron beam treatment of the electron resist to cause it to be properly differentially soluble in selected solvents. In turn, the desired electronic component pattern of the photocathode source 30 is transferred to electroresist layer 36 without alignment distortions. Further, it should be noted that if the x-ray generating marks are closely and regularly spaced, as shown in FIG. 2, the alignment can be accomplished with simply translational, i.e. $x$ and $y$, corrections, without the need for rotational correction of previous alignment systems, see U.S. Pat. No. 3,710,101 and U.S. patent application Ser. No. 264,699, filed June 20, 1972 and assigned to the same assignee as the present application.

Further, it should be noted that the alignment can be made by manually or automatically controlled by the physical movement of the member 32 and/or electromagnetic deflection of the electron beam pattern, see above-cited U.S. Pat. Nos. 3,679,497 and 3,710,101. In any case, the correction is continued until the x-ray emissions from marks 31 and 31' detected at x-ray detector means 66 and 67 indicate a predetermined alignment value for said x-ray emissions.

To illustrate the operation of the invention, silicon members of 14 mils in thickness were made with a patterned layer of gold of 1600 Angstroms in thickness on a major surface thereof. A detector was positioned adjacent the opposite surface of the member from the patterned gold layer. The detector had a sensitive thickness of 4 mils and was assumed to subtend an angle of 110° at the electron beam absorption point in a thin gold layer. A scanning electron microscope was used to provide an alignment electron beam with different energy levels. The x-rays were detected and the generated electrical signal processed utilizing phase detection as described hereinbefore. An AC electrical was generated by sweeping the electron beam over an edge of an element of the gold pattern.

The gains were then calculated for beams of different energy levels. To illustrate, using an electron beam 1 nA at 20 kev, the electrical signal detected across a 1 MΩ load resistor was 15μV. Accordingly, the gain was calculated: (15μV/1MΩ × 1nA) = 1.5percent. The following table gives the calculated theoretical and experimental gains:

TABLE 1

| Electron Beam Energy (Kev) | Current Detected/Electron Beam Current | |
|---|---|---|
| | Theoretical | Experimental |
| 10 | 0.03% | 0.003% |
| 25 | 0.53% | 0.5% |
| 20 | 1.86% | 1.5% |

The theoretical efficiencies were calculated from the relation:

$$W_x/W_e = a \cdot Z \cdot V \times 10^{-6}$$

where:
$W_x$ is the total power in the x-ray emission in watts;
$W_e$ is the total power in the electron beam in watts;
$Z$ is the atomic number of the x-ray generating material;
$V$ is the electron beam current in kilovolts; and
$a$ is a constant 1.
Therefore, considering an electron current of 1 amp, $W_x = a \cdot Z \cdot V^2 \cdot I \times 10^{-3}$ watts.

The agreement between theoretical and experimental efficiencies is reasonable considering the assumption of the theoretical calculation, e.g. complete absorption of the electron beam by the x-ray generating material. In particular, at energies above approximately 12 kev, electrons completely penetrated the gold layer and in turn a large part of the electron energy was not available for x-ray production. Further, measurements at 30 kev confirmed this fact; the measurements fell well below the predictions based on complete absorption of the electrons by the gold layer.

In a practical system, the x-ray generation layer or marks can be made sufficiently thick to stop the electron beam almost completely with little penalty in x-ray absorption of the mark. Another increase in detection efficiency can be made by reducing the wafer thickness from 16 mils to 8 mils, which is more typical of the wafer thicknesses utilized in the integrated circuit industry. Further, detectors are available with sensitivity depths of up to 25 mils, giving a means of increasing the strength of the detected signal. Together, these improvements are contemplated to increase the electrical signals by a factor between 5 and 8 in the electron energy range 10–20 kev.

To provide good resolution for the alignment system of the present invention, further consideration should be given to the conversion efficiency from electron to x-ray radiation. The x-ray generation has only about 1 percent conversion efficiency. To make up for this low gain (about 1 percent of the efficiency of the electron induced conductivity system, see above-cited U.S. Pat. No. 3,710,101, granted Jan. 9, 1973) where three variants can be used: (i) increase the area of the detector, (ii) increase the time constant of the detector means, and (iii) separate illuminate of the photocathode marks by alignment beam portions of the photocathode source:

(i) A typical detector mark as above described is a square 300 × 300 microns. An increase in both directions by a factor of 100, i.e., to 3 cm, is obviously impractical. However, periphery is more important than total area. The change in signal as the beam is moved along the direction of one of the sides of the square mark depends on the length of the other side. For this reason the use of a figure with a long periphery makes efficient use of the area on the member assigned to the alignment mark.

One especially desirable mark for this reason is a square array of equally spaced apart squares. If the separation between squares is equal to the width of a square, the total periphery in one dimension is $L^2/2l$, where L is the array dimension and $l$ is the length of the side of a small square. For L = 1.7 mm and $l$ = 50 micron, the effective periphery is 30,000 microns = 100 × 300 microns. A detector mark 1.7 mm (68 mil) square is probably not too large an area to assign for such alignment (i.e. roughly the size of a single module of an integrated circuit pattern). Greater periphery can be obtained by decreasing the value of $l$, i.e., by decreasing the size of an individual square; however, for simple unambiguous signals the separation should be made large enough that the beam corresponding to one square of the detector is never allowed to overlap a neighboring square. The size of the small squares, therefore, is determined by the required range of allowable initial misalignment from which the system can recover. In present experience ± 50 microns is a reasonable repeatable deviation to expect from mechanical prepositioning of the member.

ii. The low x-ray conversion efficiency can be compensated simply by increasing the gain used in the system. However, the noise level then becomes important because of the relatively small number of x-ray quanta generated per sec.

To produce 1 electron hole pair in the detector means requires approximately 5 eV of x-ray energy absorbed. Hence, to produce a current of 1 nA in the detector requires a rate of x-ray energy absorption of 5 $\times 10^{-9} \times 6 \times 10^{18}$ eV/sec or $3 \times 10^7$ Kev/sec. At 10 Kev electron energy the signal detected was 0.003 percent of 1 nA (see Table I), corresponding to an absorption rate of $9 \times 10^2$ Kev/sec. The average energy of a detected x-ray in such a situation would be approximately 9 Kev, since x-rays of energy much lower than 8 Kev do not get to the detector and energies above 10 Kev are not generated. Hence the approximate number of x-rays detected per sec is 100/sec. With a time constant of 1 sec the statistical fluctuation would be $100^{1/2} = 10$ or a noise to signal ratio of 10 percent. The corresponding values at 15 Kev and 20 Kev are 0.7 percent and 0.25 percent respectively. These are significantly lower than the noise levels measured in the experiment in which it required a time constant of 3 sec to reduce the noise level to 25 percent at 12 Kev. The x-rays noise should have been of the order of 4 percent in this situation.

Thus, in practice, added gain will generally necessitate an increase of the effective time constant used in the x-ray detector means. However, the time constant cannot be lengthed too greatly without a deleterious effect on the image quality in the resist exposure due to resist exposure in unregistered locations.

iii. A possible solution to such longer alignment times is the use of alignment beam portions (i.e., specific patterns on the photocathode source) which can be illuminated with ultraviolet radiation separately from the main area of the photocathode source. In this way overexposure of the main area of the member can be avoided during alignment by separately controlling the illumination for alignment and for pattern exposure.

Alignment times of 100 × 3–10 sec are obviously impractical in a commercial production. However, with separate illumination of the alignment beam portions, such illumination of the relatively small areas could be made more intense by appropriate optical coupling. Since the problem of providing relatively uniform illumination over the main area of the photocathode is absent, each alignment portion can be illuminated by an intense source such as a mercury compact arc lamp via lenses and/or mirrors allowing high photo-current to be generated over the relatively small areas. By this arrangement, alignment beam current densities of the order of 100 μA/cm², requiring ultraviolet input power of approximately 1 W/cm², can be attained with a 100 watt compact arc lamp forming an image 3 mm in diameter using an F/1 lens plus reflector. Optical filtering of the beam is used to remove non-useful radiation (e.g. visible, infrared) in order to prevent the photoemission surface from deterioration.

All three of these variants are preferably combined to some degree in practical embodiments of the x-ray alignment system of the present invention.

While the present invention is particularly suited and has been specifically described to align a scanning electron beam or an electron image projection system with a member in the accurate transfer of a desired electronic component pattern to an electroresist layer supported by a member, it is distinctly understood that the invention may be otherwise variously embodied and used within the scope of the following claims. For example, the invention may be used in the procedure for precision etching of selected areas of metal sheets to obtain desired shapes and patterns for various scientific and industrial appliations.

What is claimed is:

1. A method of precision aligning an electron beam with selected areas of a major surface of a member comprising the steps of:
    A. forming adjacent a major surface of a member a plurality of marks of predetermined shape capable of generating x-ray radiation on irradiation by an electron beam corresponding to the area of the mark irradiated;
    B. irradiating at least one of the marks with a corresponding alignment beam portion of an electron beam to be aligned, said alignment beam portion having a predetermined cross-sectional shape;
    C. detecting x-ray radiation emissions from said irradiated mark; and
    D. moving the electron beam relative to the member until the x-ray radiation emissions detected in accord with step C indicate alignment of the alignment beam portion with the corresponding mark.

2. A method of precision aligning an electron beam with selected areas of a major surface of a member as set forth in claim 1 wherein:
    the predetermined cross-sectional shape of the alignment beam portion of the electron beam corresponds in fabrication accuracy to the accuracy of alignment desired.

3. A method of precision aligning an electron beam with selected areas of a major surface of a member as set forth in claim 2 wherein:
    the predetermined shape of the marks correspond in fabrication accuracy to the accuracy of alignment desired.

4. A method of precision aligning an electron beam with selected areas of a major surface of a member as set forth in claim 1 wherein:
    the predetermined shape of each mark is substantially the same as the predetermined cross-sectional shape of the corresponding alignment beam portion.

5. A method of precision aligning an electron beam with selected areas of a major surface of a member as set forth in claim 1 wherein:
    forming each mark includes positioning an opaque layer adjacent a layer of x-ray generating material to circumscribe a portion of said layer in the predetermined shape and cause a differential in x-ray radiation projected by said layer at said portion on irradiation.

6. A method of precision aligning an electron beam with selected areas of a major surface of a member as set forth in claim 1 wherein:
    the major surface of the member is divided into contiguous fields with the marks positiond symmetrically along boundaries between said contiguous fields.

7. A method of precision aligning an electron beam with selected areas of a major surface of a member as set forth in claim 6 wherein:
    the electron beam to be aligned is a scanning electron beam for selectively irradiating an electroresist layer on the major surface of the member.

8. A method of precision aligning a patterned electron beam generated by a photocathode source with selected areas of a major surface of a member comprising the steps of:
    A. forming adjacent a major surface of a member having at least two widely spaced marks of predetermined shape capable of generating x-ray radiation on irradiation by an electron beam corresponding to the area of the mark irradiated;
    B. irradiating the marks with corresponding alignment beam portions of a patterned electron beam generated by a photocathode source, each said alignment beam portion having a predetermined cross-sectional shape;
    C. detecting x-ray radiation emissions from said irradiated mark; and
    D. moving the patterned electron beam relative to the member until the x-ray radiation emissions detected in accord with step C indicate alignment of the alignment beam portions with the corresponding marks.

9. A method of precision aligning a patterned electron beam generated by a photocathode source with selected areas of a major surface of a member as set forth in claim 8 wherein:
    the predetermined cross-sectional shape of the alignment beam portions of the electron beam correspond in fabrication accuracy to the accuracy of alignment desired.

10. A method of precision aligning a patterned electron beam generated by a photocathode source with selected areas of a major surface of a member as set forth in claim 9 wherein:
    the predetermined shape of the marks correspond in fabrication accuracy to the accuracy of alignment desired.

11. A method of precision aligning a patterned electron beam generated by a photocathode source with selected areas of a major surface of a member as set forth in claim 8 wherein:
    the predetermined shape of each mark is substantially the same as predetermined cross-sectional shape of the corresponding alignment beam portion.

12. A method of precision aligning a patterned electron beam generated by a photocathode source with selected areas of a major surface of a member as set forth in claim 8 wherein:
    forming each mark includes positioning an opaque layer adjacent a layer of x-ray generating material to circumscribe a portion of said layer in the predetermined shape and cause a differential in x-ray radiation projected by said layer at said portion on irradiation.

13. A method of precision aligning a patterned electron beam generated by a photocathode source with selected areas of a major surface of a member as set forth in claim 8 wherein:

step D is automatically performed by electrically processing the electrical signal output corresponding to the detected x-ray radiation on modulation of the movement of the alignment beam portions over the corresponding marks.

14. Apparatus for selectively irradiating precisely located areas of a major surface of a member comprising:

A. a photocathode source for generating a patterned beam of electrons including at least one alignment beam portion of predetermined cross-sectional shape;

B. at least one mark corresponding to each alignment beam portion and capable of generating x-ray radiation on irradiation with an electron beam corresponding to the area of the mark irradiated with the electron beam, each said mark being supported adjacent a major surface of a member to be aligned with the patterned beam of electrons and having a predetermined shape;

C. means for positioning the member in a spaced relation to the photocathode source for the patterned beam;

D. means for applying a potential between the member and the photocathode source whereby electrons from the photocathode source are directed to and selectively irradiate selected areas of the major surface of the member;

E. electromagnetic means for directing the patterned beam of electrons from the photocathode source to irradiate selected portions of the major surface of the member close to the selected areas wherein each alignment beam portion irradiates selected portions of the surface portions of the major surface of the member close to a corresponding mark;

F. detector means for detecting the x-ray radiation projected by the corresponding mark and producing an electrical signal corresponding to the area thereof irradiated by the alignment beam portions; and G. electrical means for moving the patterned beam of electrons relative to the member responsive to said electrical signal from the detector means to cause the alignment beam portions to align with corresponding marks, whereby the patterned beam of electrons from the photocathode source is located relative to the member so that precisely located areas of the major surface of the member can be selectively irradiated with the patterned electron beam.

15. Apparatus for selectively irradiating precisely located areas of a major surface of a member as set forth in claim 14 wherein:

the patterned beam of electrons generated by the photocathode source includes at least two spaced apart alignment beam portions of predetermined cross-sectional shape.

16. Apparatus for selectively irradiating precisely located areas of a major surface of a substrate as set forth in claim 15 wherein:

the electrical means includes modulation means for oscillating the movement of each alignment beam portion on a corresponding mark, phase detection means for detecting along orthogonal axes the error from coincidence of the alignment beam portions and the marks and outputting the electrical signal corresponding thereto, and actuating means for changing the electrical input to the electromagnetic means responsive to the electrical signal from the phase detector means to bring the alignment beam portions and the marks into alignment.

* * * * *